(12) United States Patent
Sugimoto et al.

(10) Patent No.: US 11,751,298 B2
(45) Date of Patent: Sep. 5, 2023

(54) LIGHT-EMITTING DEVICE

(71) Applicant: NICHIA CORPORATION, Anan (JP)

(72) Inventors: Norihiro Sugimoto, Komatsushima (JP); Shinsuke Sannabe, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/145,288

(22) Filed: Dec. 22, 2022

(65) Prior Publication Data
US 2023/0225022 A1 Jul. 13, 2023

(30) Foreign Application Priority Data

Jan. 7, 2022 (JP) .................... 2022-001406
Jan. 24, 2022 (JP) .................... 2022-008446

(51) Int. Cl.
*H05B 33/02* (2006.01)
*H05B 33/12* (2006.01)

(52) U.S. Cl.
CPC .......... *H05B 33/02* (2013.01); *H05B 33/12* (2013.01)

(58) Field of Classification Search
CPC .................. H05B 33/02; H05B 33/12
See application file for complete search history.

(56) References Cited

U.S. PATENT DOCUMENTS

| 2011/0062473 A1* | 3/2011 | Tanuma .................. H01L 33/56 257/E33.056 |
| 2016/0341395 A1 | 11/2016 | Kiyota et al. |
| 2017/0317467 A1 | 11/2017 | Miura et al. |
| 2018/0287335 A1 | 10/2018 | Kozuru et al. |

FOREIGN PATENT DOCUMENTS

| JP | H04-107861 U | 9/1992 |
| JP | 3127836 U | 12/2006 |
| JP | 2015-057866 A | 3/2015 |
| JP | 2016-219779 A | 12/2016 |
| JP | 2017-201684 A | 11/2017 |
| JP | 2018-170426 A | 11/2018 |

\* cited by examiner

*Primary Examiner* — Mary Ellen Bowman
(74) *Attorney, Agent, or Firm* — Foley & Lardner LLP (57) ABSTRACT

An upper surface of a lateral wall portion of a substrate includes a first upper surface portion exposed from a light-transmissive member in a first region, a second upper surface portion exposed from the light-transmissive member in a second region, and a third upper surface portion located between the first upper surface portion and the second upper surface portion in a second direction, and an upper surface of an outer peripheral portion of the light-transmissive member includes a first outer peripheral surface portion located in the first region. An area of the first upper surface portion of the lateral wall portion is greater than an area of the first outer peripheral surface portion of the outer peripheral portion of the light-transmissive member. A bonding member is disposed between the third upper surface portion of the lateral wall portion and the first lower surface portion of the light-transmissive member.

10 Claims, 10 Drawing Sheets

LIGHT-EMITTING DEVICE

CROSS-REFERENCE TO RELATED APPLICATION

This application claims priority to Japanese Patent Application No. 2022-001406, filed on Jan. 7, 2022, and Japanese Patent Application No. 2022-008446, filed on Jan. 24, 2022, the disclosures of which are hereby incorporated by reference in their entireties.

BACKGROUND

The present disclosure relates to a light-emitting device.

A configuration of a light-emitting device in which a light-emitting element is disposed in a recess of a substrate and in which a light-transmissive member is bonded to the substrate to cover the recess from above is known (See, for example, Japanese Patent Publication No. 2015-57866 and Japanese Utility Model Publication No. 1992-107861).

SUMMARY

An object of the present disclosure is to provide a light-emitting device with an improved light extraction efficiency that is unlikely to be damaged.

In an embodiment of the present disclosure, a light-emitting device has a first side extending in a first direction, a second side extending in the first direction and being parallel to the first side, a third side extending in a second direction orthogonal to the first direction, a fourth side extending in the second direction and being parallel to the third side, a first region located in a corner formed by the first side and the third side, and a second region located in a corner formed by the second side and the third side in a plan view. The light-emitting device includes: a substrate including a lateral wall portion and a bottom portion surrounded by the lateral wall portion; a light-emitting element disposed on the bottom portion; a light-transmissive member disposed on or above the substrate to cover the bottom portion; and a bonding member disposed between an upper surface of the lateral wall portion and a lower surface of the light-transmissive member to bond the lateral wall portion and the light-transmissive member together. The light-transmissive member includes a projection covering the bottom portion of the substrate and an outer peripheral portion surrounding the projection in a plan view. The upper surface of the lateral wall portion includes a first upper surface portion exposed from the light-transmissive member in the first region, a second upper surface portion exposed from the light-transmissive member in the second region, and a third upper surface portion located between the first upper surface portion and the second upper surface portion in the second direction. An upper surface of the outer peripheral portion includes a first outer peripheral surface portion located in the first region. A lower surface of the outer peripheral portion includes a second outer peripheral surface portion opposite to the first outer peripheral surface portion. An area of the first upper surface portion of the lateral wall portion is greater than an area of the first outer peripheral surface portion of the outer peripheral portion. The lower surface of the light-transmissive member includes a first lower surface portion facing the third upper surface portion. An area in which the first lower surface portion and the third upper surface portion face each other is greater than an area in which the second outer peripheral surface portion and the upper surface of the lateral wall portion face each other. The bonding member is disposed between the third upper surface portion and the first lower surface portion.

According to the present disclosure, a light-emitting device with an improved light extraction efficiency that is unlikely to be damaged can be provided.

DETAILED DESCRIPTION

Certain embodiments will be described below with reference to the accompanying drawings. In the drawings, the same reference numeral is applied to the same component. Each drawing schematically shows the embodiment. The scales, distances, positional relationships, and the like of members may be exaggerated, or illustration of portions of members may be omitted. Also, cross-sectional end views showing only cut surfaces of members may be used as cross-sectional views.

In the description below, components having substantially the same function will be shown with the same reference numerals, and repeated descriptions of such components may be omitted. Terms representing particular directions or positions (such as "up/upper," "down/lower," and other terms including or related to the meanings of these terms) may be used. These terms are used merely for the sake of ease of explanation, representing relative directions or relative positions in the referenced drawings. As far as the relative directions or positions mentioned by the terms "up/upper," "down/lower," and the like designate the same directions or positions in the reference drawings, drawings other than shown in the present disclosure, actual products, and the like do not have to have the same arrangement as shown in the reference drawings. The term "parallel" as used in the present specification includes not only the case in which extensions of two straight lines, sides, surfaces, or the like do not intersect each other but also the case in which two straight lines, sides, surfaces, or the like forms an angle of 10° or less. In the present specification, a positional relationship expressed as "on" includes the case in which objects are in contact with each other and the case in which an object is not in contact with but is located above the other.

Figure 1:
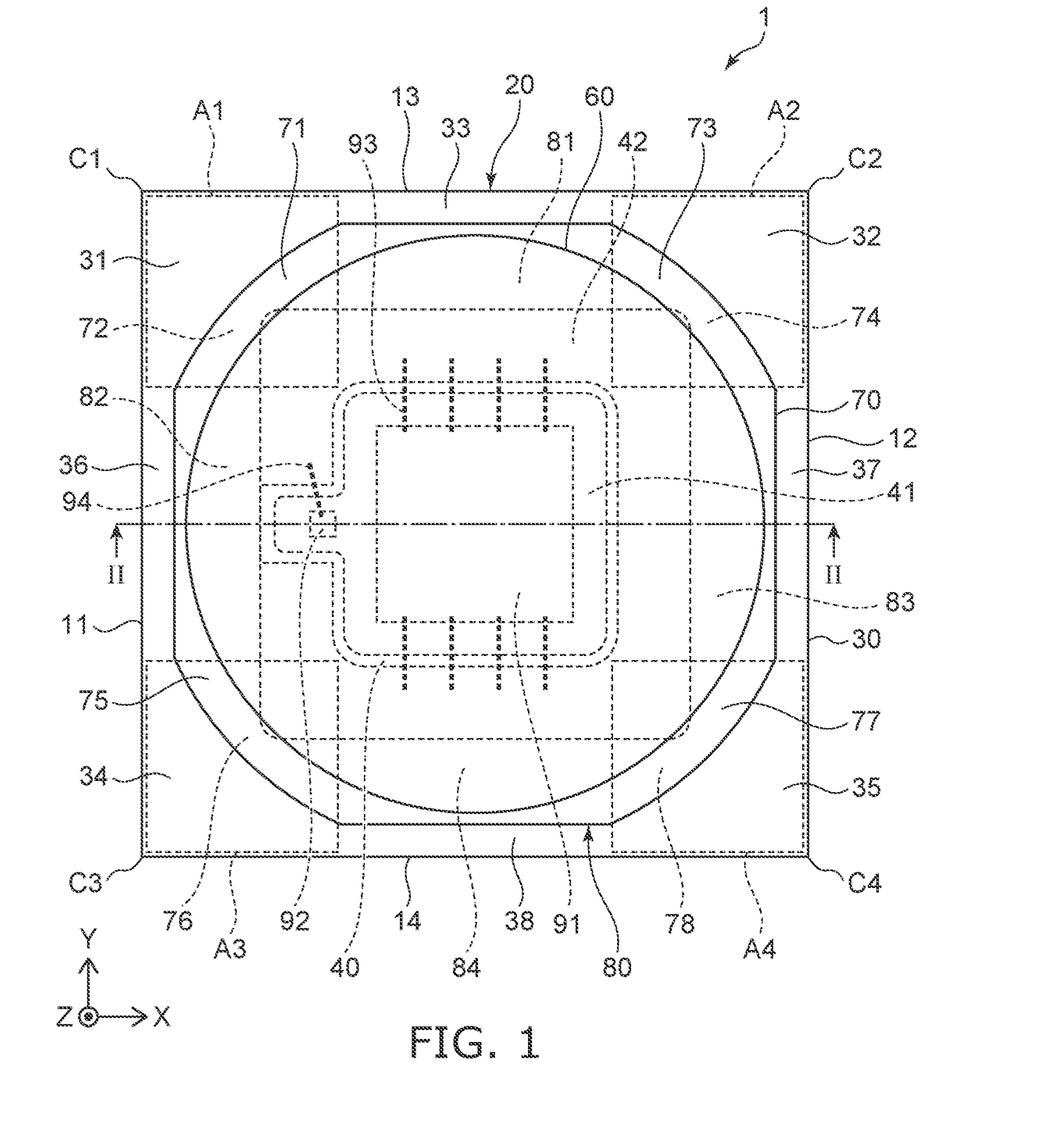
FIG. 1 is a schematic plan view of an upper surface of a light-emitting device of one embodiment of the present disclosure.

A light-emitting device 1 of one embodiment of the present disclosure has a first side 11 extending in a first direction Y, a second side 12 that extends in the first direction Y and is parallel to the first side 11, a third side 13 extending in a second direction X orthogonal to the first direction Y, and a fourth side 14 that extends in the second direction X and is parallel to the third side 13 in a top view from the upper surface of the light-emitting device 1 as shown in FIG. 1. The first side 11, the second side 12, the third side 13, and the fourth side 14 are part of a substrate 20 to be described below.

The upper surface of the light-emitting device 1 has a first region A1 located at a first corner C1 formed by the first side 11 and the third side 13, a second region A2 located at a second corner C2 formed by the second side 12 and the third side 13, a third region A3 located at a third corner C3 formed by the first side 11 and the fourth side 14, and a fourth region A4 located at a fourth corner C4 formed by the second side 12 and the fourth side 14.

In the example shown in FIG. 1, the first side 11, the second side 12, the third side 13, and the fourth side 14 define the outer periphery of the light-emitting device 1 in a top view.

FIG. 1 shows an example in which the angles of the first corner C1, the second corner C2, the third corner C3, and the fourth corner C4 are right angles, but the angles of the first corner C1, the second corner C2, the third corner C3, and the fourth corner C4 may be other angles than right angles. The angles of the first corner C1, the second corner C2, the third corner C3, and the fourth corner C4 may be different from one another.

The first corner C1, the second corner C2, the third corner C3, and the fourth corner C4 may be rounded corners or have shapes in which the corners are removed so as to be arc shapes. In this case, the corner formed by the extension of the first side 11 and the extension of the third side 13 can be defined as the first corner C1, the corner formed by the extension of the second side 12 and the extension of the third side 13 can be defined as the second corner C2, the corner formed by the extension of the first side 11 and the extension of the fourth side 14 can be defined as the third corner C3, and the corner formed by the extension of the second side 12 and the extension of the fourth side 14 can be defined as the fourth corner C4.

The length of each of the first region A1 and the second region A2 in the second direction X is preferably ⅙ or more and ⅓ or less of the length of the third side 13. The length of each of the third region A3 and the fourth region A4 in the second direction X is preferably ⅙ or more and ⅓ or less of the length of the fourth side 14. The length of each of the first region A1 and the third region A3 in the first direction Y is preferably ⅙ or more and ⅓ or less of the length of the first side 11. The length of each of the second region A2 and the fourth region A4 in the first direction Y is preferably ⅙ or more and ⅓ or less of the length of the second side 12.

Figure 2:
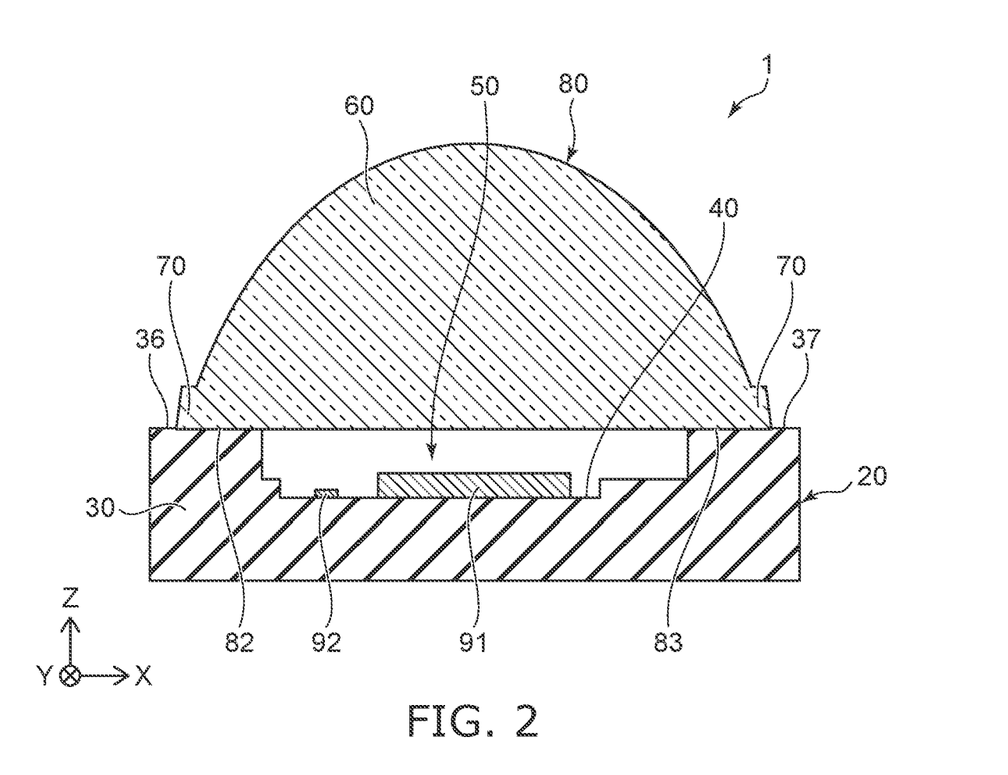
FIG. 2 is a schematic cross-sectional view taken along the line II-II of FIG. 1.
Figure 5:
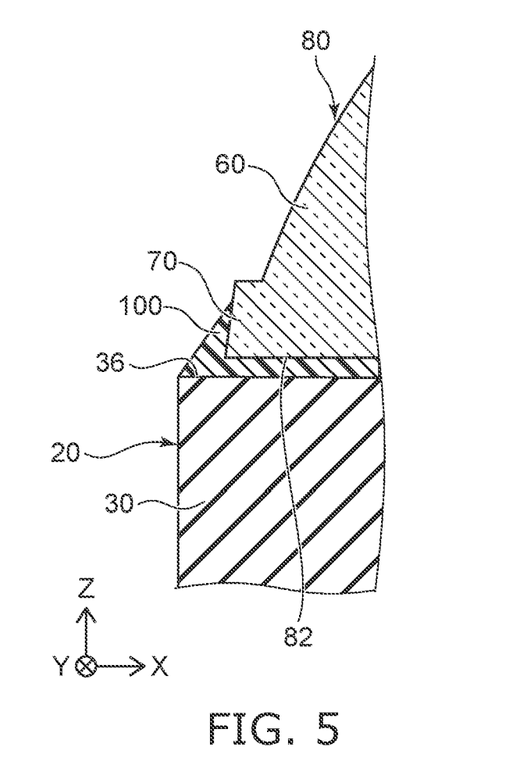
FIG. 5 is a schematic enlarged cross-sectional view of a portion of the light-emitting device of the embodiment of the present disclosure.

As shown in FIG. 1, FIG. 2, and FIG. 5, the light-emitting device 1 includes the substrate 20, a light-emitting element 91, a light-transmissive member 80, and bonding members 100. The direction orthogonal to the first direction Y and the second direction X and extending from the substrate 20 to the light-transmissive member 80 is referred to as a third direction Z.

The substrate 20 is formed of an insulating material. For example, the substrate 20 is formed of a ceramic. Examples of the ceramic include aluminum nitride, aluminum oxide, and mullite. The substrate 20 includes a lateral wall portion 30 and a bottom portion 40 surrounded by the lateral wall portion 30. The lateral wall portion 30 and the bottom portion 40 define a recess.

The upper surface of the lateral wall portion 30 includes a first upper surface portion 31, a second upper surface portion 32, a third upper surface portion 33, a fourth upper surface portion 34, a fifth upper surface portion 35, a sixth upper surface portion 36, a seventh upper surface portion 37, and an eighth upper surface portion 38. At least a portion of the first upper surface portion 31 is exposed from the light-transmissive member 80 in the first region A1. The second upper surface portion 32 is exposed from the light-transmissive member 80 in the second region A2. The third upper surface portion 33 is located between the first upper surface portion 31 and the second upper surface portion 32 in the second direction X. At least a portion of the fourth upper surface portion 34 is exposed from the light-transmissive member 80 in the third region A3. At least a portion of the fifth upper surface portion 35 is exposed from the light-transmissive member 80 in the fourth region A4. The sixth upper surface portion 36 is located between the first upper surface portion 31 and the fourth upper surface portion 34 in the first direction Y. The seventh upper surface portion 37 is located between the second upper surface portion 32 and the fifth upper surface portion 35 in the first direction Y. The eighth upper surface portion 38 is located between the fourth upper surface portion 34 and the fifth upper surface portion 35 in the second direction X.

In the first region A1, the upper surface of the lateral wall portion 30 includes the first upper surface portion 31 exposed from the light-transmissive member 80 and an upper surface facing the lower surface of the light-transmissive member 80. In the second region A2, the upper surface of the lateral wall portion 30 includes the second upper surface portion 32 exposed from the light-transmissive member 80 and an upper surface facing the lower surface of the light-transmissive member 80. In the third region A3, the upper surface of the lateral wall portion 30 includes the fourth upper surface portion 34 exposed from the light-transmissive member 80 and an upper surface facing the lower surface of the light-transmissive member 80. In the fourth region A4, the upper surface of the lateral wall portion 30 includes the fifth upper surface portion 35 exposed from the light-transmissive member 80 and an upper surface facing the lower surface of the light-transmissive member 80.

Figure 3:
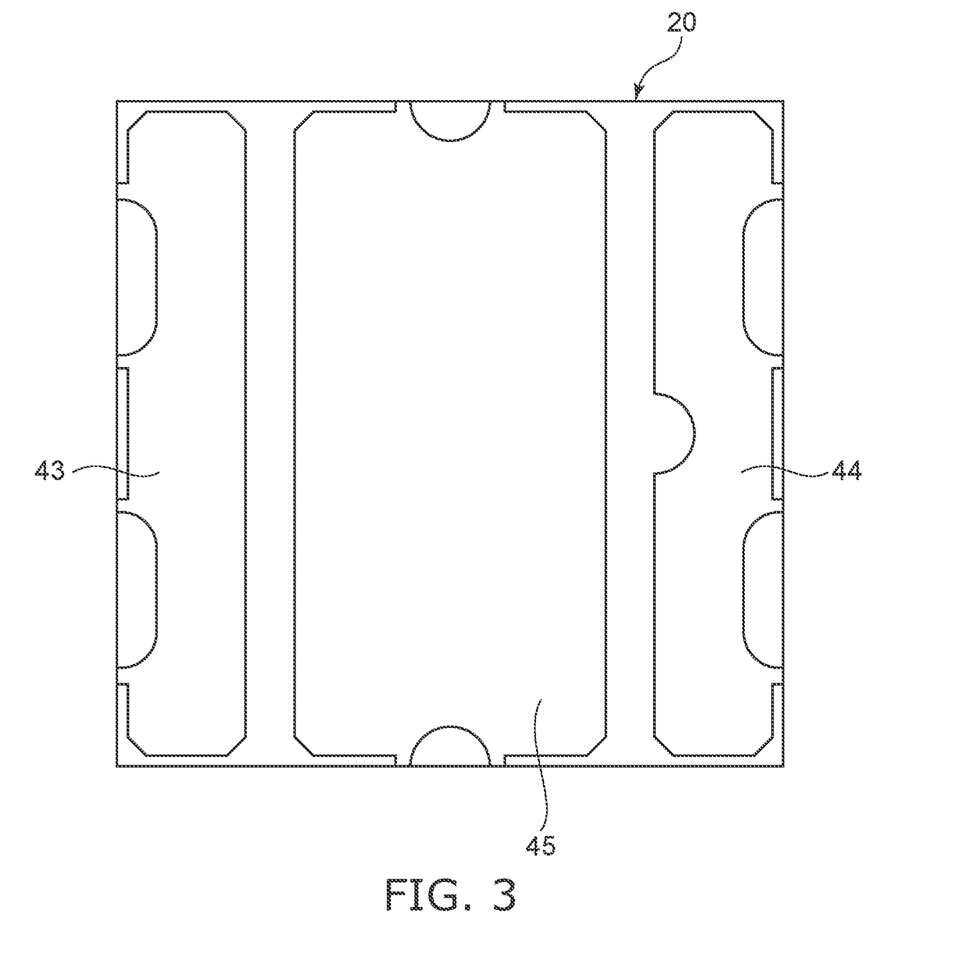
FIG. 3 is a schematic plan view of a lower surface of the light-emitting device of the embodiment of the present disclosure.
Figure 4:
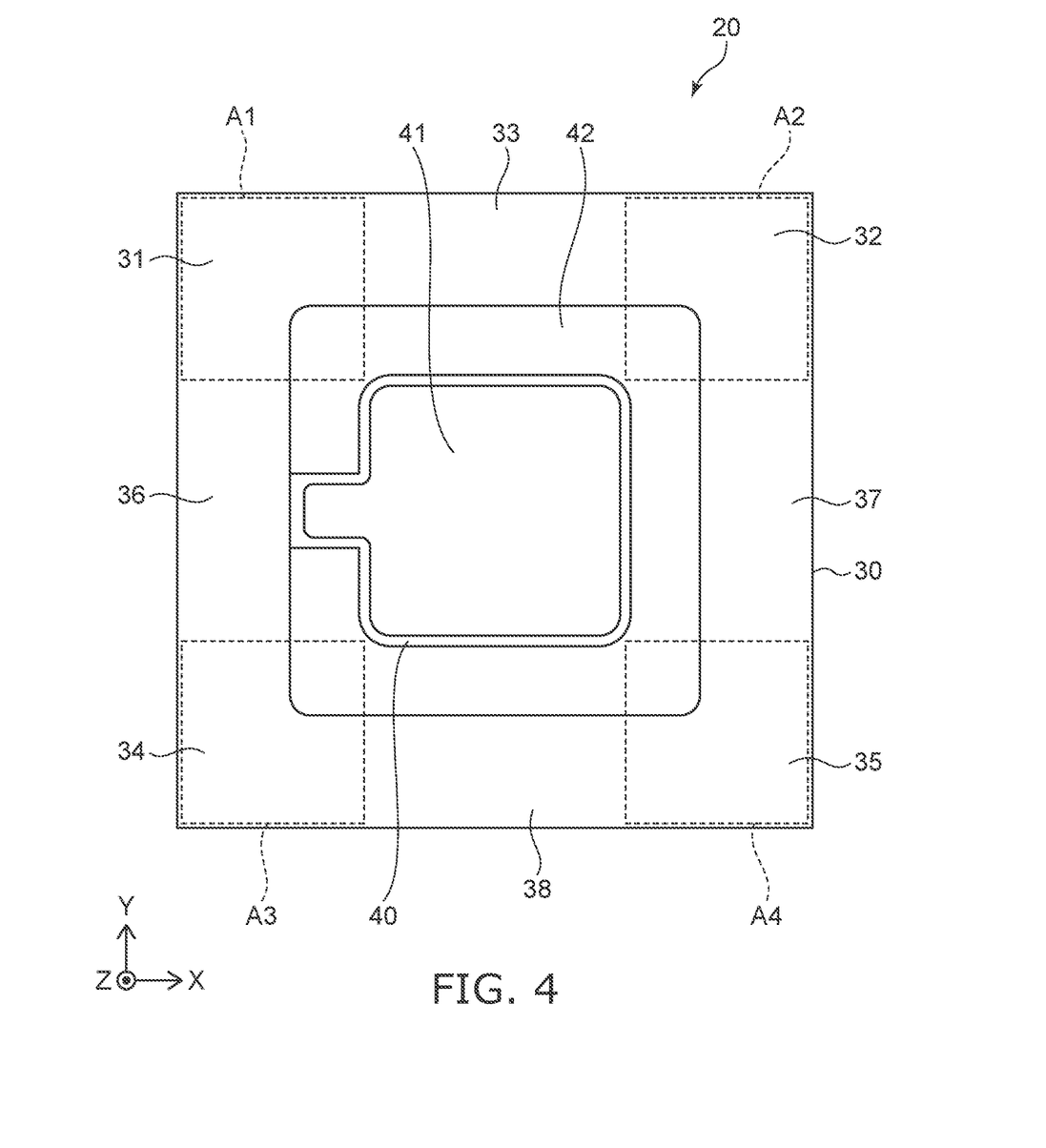
FIG. 4 is a schematic plan view of a substrate in the light-emitting device of the embodiment of the present disclosure.

A first wiring portion 41 and a second wiring portion 42 are disposed on the bottom portion 40 of the substrate 20 as shown in FIG. 4. A third wiring portion 43 and a fourth wiring portion 44 are disposed on the lower surface of the substrate 20 as shown in FIG. 3. Anode potential is applied to one of the third wiring portion 43 and the fourth wiring portion 44, and cathode potential is applied to the other.

The third wiring portion 43 is electrically connected to the first wiring portion 41. For example, anode potential is applied to the first wiring portion 41 through the third wiring portion 43. The fourth wiring portion 44 is electrically connected to the second wiring portion 42. For example, cathode potential is applied to the second wiring portion 42 through the fourth wiring portion 44. A metal portion 45 is disposed on the lower surface of the substrate 20. The metal portion 45 can function as a heat dissipation member that dissipates heat generated from the light-emitting element 91. The metal portion 45 is located between the third wiring portion 43 and the fourth wiring portion 44 apart from the third wiring portion 43 and the fourth wiring portion 44 and is not electrically connected to the third wiring portion 43 or the fourth wiring portion 44.

The light-emitting element 91 is disposed on the bottom portion 40 of the substrate 20. The light-emitting element 91 is located in a space 50 defined by the lateral wall portion 30 and the bottom portion 40 of the substrate 20 and the light-transmissive member 80. For example, the light-emitting element 91 emits ultraviolet light. The light-emitting element 91 may emit visible light.

A lower electrode is provided on the lower surface of the light-emitting element 91. For example, the lower electrode of the light-emitting element 91 is bonded to the first wiring portion 41 with solder or electroconductive paste therebetween and electrically connected to the first wiring portion 41. An upper electrode is provided on the upper surface of the light-emitting element 91. The upper electrode of the light-emitting element 91 is electrically connected to the second wiring portion 42 via an electroconductive wire 93. For example, the electroconductive wire 93 is formed of Au.

A protective element 92 may be disposed on the bottom portion 40 of the substrate 20. For example, the protective element 92 is a Zener diode. A lower electrode is provided on the lower surface of the protective element 92. For example, the lower electrode of the protective element 92 is bonded to the first wiring portion 41 with solder or electroconductive paste therebetween and electrically connected to the first wiring portion 41. An upper electrode is provided on the upper surface of the protective element 92. The upper electrode of the protective element 92 is electrically connected to the second wiring portion 42 via an electroconductive wire 94. For example, the electroconductive wire 94 is formed of Au.

The light-transmissive member 80 is disposed over the substrate 20 in the third direction Z to cover the bottom portion 40. The light-transmissive member 80 is disposed on the substrate 20 so as to cover the space 50 in which the light-emitting element 91 is disposed, from above. The light-transmissive member 80 transmits light emitted from the light-emitting element 91. For the material of the light-transmissive member 80, an inorganic material formed of at least one selected from the group consisting of, for example, borosilicate glass, quartz glass, calcium fluoride glass, aluminoborosilicate glass, oxynitride glass, chalcogenide glass, and sapphire can be used.

The light-transmissive member 80 includes a projection 60 covering the bottom portion 40 of the substrate 20, and an outer peripheral portion 70 surrounding the projection 60 in a top view. The projection 60 functions as a lens for condensing or diffusing light emitted from the light-emitting element 91. The outer peripheral portion 70 is located between the outer periphery of the projection 60 and the outer periphery (the first side 11, the second side 12, the third side 13, and the fourth side 14) of the light-emitting device 1 in a top view as shown in FIG. 1.

The upper surface of the outer peripheral portion 70 of the light-transmissive member 80 includes a first outer peripheral surface portion 71 located in the first region A1, a third outer peripheral surface portion 73 located in the second region A2, a fifth outer peripheral surface portion 75 located in the third region A3, and a seventh outer peripheral surface portion 77 located in the fourth region A4. A portion of the first outer peripheral surface portion 71, a portion of the third outer peripheral surface portion 73, a portion of the fifth outer peripheral surface portion 75, and a portion of the seventh outer peripheral surface portion 77 overlap with the bottom portion 40 in a top view.

The lower surface of the outer peripheral portion 70 of the light-transmissive member 80 includes a second outer peripheral surface portion 72 opposite to the first outer peripheral surface portion 71, a fourth outer peripheral surface portion 74 opposite to the third outer peripheral surface portion 73, a sixth outer peripheral surface portion 76 opposite to the fifth outer peripheral surface portion 75, and an eighth outer peripheral surface portion 78 opposite to the seventh outer peripheral surface portion 77.

The lower surface of the light-transmissive member 80 includes a first lower surface portion 81 facing the third upper surface portion 33 of the lateral wall portion 30 of the substrate 20, a second lower surface portion 82 facing the sixth upper surface portion 36 of the lateral wall portion 30 of the substrate 20, a third lower surface portion 83 facing the seventh upper surface portion 37 of the lateral wall portion 30 of the substrate 20, and a fourth lower surface portion 84 facing the eighth upper surface portion 38 of the lateral wall portion 30 of the substrate 20.

The bonding members 100 are disposed between the upper surface of the lateral wall portion 30 of the substrate 20 and the lower surface of the light-transmissive member 80 as shown in FIG. 5 to bond the lateral wall portion 30 and the light-transmissive member 80 together. For example, a thermosetting resin can be used for the bonding members 100.

Figure 8A:
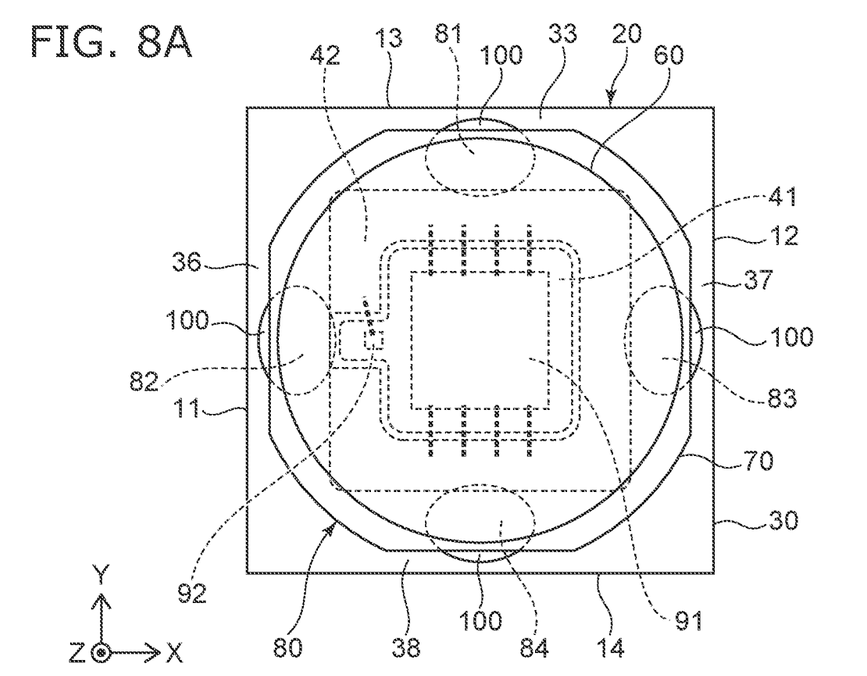
FIG. 8A is a schematic plan view of the upper surface of the light-emitting device showing an example of the arrangement of bonding members in the light-emitting device of the embodiment of the present disclosure.

The bonding members 100 are disposed between the third upper surface portion 33 of the lateral wall portion 30 of the substrate 20 and the first lower surface portion 81 of the light-transmissive member 80, between the sixth upper surface portion 36 of the lateral wall portion 30 of the substrate 20 and the second lower surface portion 82 of the light-transmissive member 80, between the seventh upper surface portion 37 of the lateral wall portion 30 of the substrate 20 and the third lower surface portion 83 of the light-transmissive member 80, and between the eighth upper surface portion 38 of the lateral wall portion 30 of the substrate 20 and the fourth lower surface portion 84 of the light-transmissive member 80 as shown in FIG. 8A.

After the bonding members 100 in the uncured state are disposed on the third upper surface portion 33, the sixth upper surface portion 36, the seventh upper surface portion 37, and the eighth upper surface portion 38 of the lateral wall portion 30 of the substrate 20, the light-transmissive member 80 is disposed on the substrate 20. The bonding members 100 in the uncured state spread between the third upper surface portion 33 of the lateral wall portion 30 and the first lower surface portion 81 of the light-transmissive member 80, between the sixth upper surface portion 36 of the lateral wall portion 30 and the second lower surface portion 82 of the light-transmissive member 80, between the seventh upper surface portion 37 of the lateral wall portion 30 and the third lower surface portion 83 of the light-transmissive member 80, and between the eighth upper surface portion 38 of the lateral wall portion 30 and the fourth lower surface portion 84 of the light-transmissive member 80. After that, the bonding members 100 are cured by, for example, heating.

The bonding members 100 in the uncured state may creep up the lateral surface of the outer peripheral portion 70 of the light-transmissive member 80 from the upper surface of the lateral wall portion 30 of the substrate 20 as shown in FIG. 5. In this case, the bonding members 100 after being cured form what is called fillets. With this structure, the bonding strength between the light-transmissive member 80 and the lateral wall portion 30 of the substrate 20 can be further improved.

Partially disposing the bonding members 100 on the upper surface of the lateral wall portion 30 of the substrate 20 can reduce, for example, the stress applied to the light-transmissive member 80 at the time of bonding compared with the case in which a bonding member 100 is disposed on the entire upper surface of the lateral wall portion 30. When the bonding members 100 are partially disposed on the upper surface of the lateral wall portion 30, gaps are formed between the lower surface of the light-transmissive member 80 and the upper surface of the lateral wall portion 30 of the substrate 20 in portions of the upper surface of the lateral wall portion 30 on which the bonding members 100 are not disposed. The space 50 in which the light-emitting element 91 is disposed is connected to the outside of the light-emitting device 1 through these gaps. In this case, the space 50 in which the light-emitting element 91 is disposed is not hermetically sealed from the outside of the light-emitting device 1.

When the light-emitting device 1 is mounted on a mounting substrate or the like, for example, suction on the upper surface of the light-emitting device 1 can be performed with a nozzle connected to an air suction device. For example, the light-emitting device 1 may be picked up by suction with a tip surface of the nozzle being in contact with the upper surface of the outer peripheral portion 70 of the light-transmissive member 80.

Accordingly, in each of the first region A1, the second region A2, the third region A3, and the fourth region A4 located in the four corners of the upper surface of the light-emitting device 1, the area of the portion of the upper surface of the lateral wall portion 30 of the substrate 20 exposed from the light-transmissive member 80 is greater than the area of the upper surface of the outer peripheral portion 70 of the light-transmissive member 80 in the embodiment.

That is, the area of the first upper surface portion 31 of the lateral wall portion 30 of the substrate 20 is greater than the area of the first outer peripheral surface portion 71 of the outer peripheral portion 70 of the light-transmissive member 80. The area of the second upper surface portion 32 of the lateral wall portion 30 of the substrate 20 is greater than the area of the third outer peripheral surface portion 73 of the outer peripheral portion 70 of the light-transmissive member 80. The area of the fourth upper surface portion 34 of the lateral wall portion 30 of the substrate 20 is greater than the area of the fifth outer peripheral surface portion 75 of the outer peripheral portion 70 of the light-transmissive member 80. The area of the fifth upper surface portion 35 of the lateral wall portion 30 of the substrate 20 is greater than the area of the seventh outer peripheral surface portion 77 of the outer peripheral portion 70 of the light-transmissive member 80.

On the diagonal connecting the first corner C1 and the fourth corner C4, the width of the first upper surface portion 31 of the lateral wall portion 30 of the substrate 20 is greater than the width of the first outer peripheral surface portion 71 of the outer peripheral portion 70 of the light-transmissive member 80. On the diagonal connecting the first corner C1 and the fourth corner C4, the width of the fifth upper surface portion 35 of the lateral wall portion 30 of the substrate 20 is greater than the width of the seventh outer peripheral surface portion 77 of the outer peripheral portion 70 of the light-transmissive member 80. On the diagonal connecting the second corner C2 and the third corner C3, the width of the second upper surface portion 32 of the lateral wall portion 30 of the substrate 20 is greater than the width of the third outer peripheral surface portion 73 of the outer peripheral portion 70 of the light-transmissive member 80. On the diagonal connecting the second corner C2 and the third corner C3, the width of the fourth upper surface portion 34 of the lateral wall portion 30 of the substrate 20 is greater than the width of the fifth outer peripheral surface portion 75 of the outer peripheral portion 70 of the light-transmissive member 80.

With this structure, in the first region A1, the second region A2, the third region A3, and the fourth region A4 of the upper surface of the light-emitting device 1, suction on the first upper surface portion 31, the second upper surface portion 32, the fourth upper surface portion 34, and the fifth upper surface portion 35 of the lateral wall portion 30 of the substrate 20 can be stably performed with the nozzle. The first outer peripheral surface portion 71, the third outer peripheral surface portion 73, the fifth outer peripheral surface portion 75, and the seventh outer peripheral surface portion 77 of the outer peripheral portion 70 of the light-transmissive member 80 are not brought into contact with the nozzle, so that the light-transmissive member 80 is less likely to be damaged.

In order to reduce damage to the substrate 20 with which the nozzle is brought into contact, the substrate 20 preferably has hardness higher than the light-transmissive member 80. For example, the material of the light-transmissive member 80 can be glass, and the material of the substrate 20 can be aluminum nitride.

In the first region A1, the second region A2, the third region A3, and the fourth region A4, the area of the upper surface of the lateral wall portion 30 of the substrate 20 exposed from the light-transmissive member 80 is made to be large, so that the area of the lower surface of the light-transmissive member 80 facing the upper surface of the lateral wall portion 30 of the substrate 20 is relatively small.

In the embodiment, the area in which the first lower surface portion 81 of the light-transmissive member 80 faces the third upper surface portion 33 of the lateral wall portion 30 of the substrate 20 is greater than the area in which the second outer peripheral surface portion 72 of the light-transmissive member 80 faces the upper surface of the lateral wall portion 30 of the substrate 20. The area in which the first lower surface portion 81 of the light-transmissive member 80 faces the third upper surface portion 33 of the lateral wall portion 30 of the substrate 20 is greater than the area in which the fourth outer peripheral surface portion 74 of the light-transmissive member 80 faces the upper surface of the lateral wall portion 30 of the substrate 20.

Similarly, the area in which the second lower surface portion 82 of the light-transmissive member 80 faces the sixth upper surface portion 36 of the lateral wall portion 30 of the substrate 20 is greater than each of the area in which the second outer peripheral surface portion 72 of the light-transmissive member 80 faces the upper surface of the lateral wall portion 30 of the substrate 20 and the area in which the sixth outer peripheral surface portion 76 of the light-transmissive member 80 faces the upper surface of the lateral wall portion 30 of the substrate 20. The area in which the third lower surface portion 83 of the light-transmissive member 80 faces the seventh upper surface portion 37 of the lateral wall portion 30 of the substrate 20 is greater than each of the area in which the fourth outer peripheral surface portion 74 of the light-transmissive member 80 faces the upper surface of the lateral wall portion 30 of the substrate 20 and the area in which the eighth outer peripheral surface portion 78 of the light-transmissive member 80 faces the upper surface of the lateral wall portion 30 of the substrate 20. The area in which the fourth lower surface portion 84 of the light-transmissive member 80 faces the eighth upper surface portion 38 of the lateral wall portion 30 of the substrate 20 is greater than each of the area in which the sixth outer peripheral surface portion 76 of the light-transmissive member 80 faces the upper surface of the lateral wall portion 30 of the substrate 20 and the area in which the eighth outer peripheral surface portion 78 of the light-transmissive member 80 faces the upper surface of the lateral wall portion 30 of the substrate 20.

That is, the area in which the lower surface of the light-transmissive member 80 and the upper surface of the lateral wall portion 30 of the substrate 20 are bonded together with the bonding members 100 is greater than the area in which the lower surface of the outer peripheral portion 70 of the light-transmissive member 80 faces the upper surface of the lateral wall portion 30 of the substrate 20 in the first region A1, the second region A2, the third region A3, and the fourth region A4. With this structure, the bonding strength between the lower surface of the light-transmissive member 80 and the upper surface of the lateral wall portion 30 of the substrate 20 using the bonding members 100 can be improved.

The first lower surface portion 81 of the light-transmissive member 80 includes the lower surface of the projection 60 and the lower surface of the outer peripheral portion 70. On the first lower surface portion 81 of the light-transmissive member 80, the area in which the lower surface of the projection 60 faces the third upper surface portion 33 of the lateral wall portion 30 of the substrate 20 can be greater than the area in which the lower surface of the outer peripheral portion 70 faces the third upper surface portion 33.

The second lower surface portion 82 of the light-transmissive member 80 includes the lower surface of the projection 60 and the lower surface of the outer peripheral portion 70. On the second lower surface portion 82 of the light-transmissive member 80, the area in which the lower surface of the projection 60 faces the sixth upper surface portion 36 of the lateral wall portion 30 of the substrate 20 can be greater than the area in which the lower surface of the outer peripheral portion 70 faces the sixth upper surface portion 36.

The third lower surface portion 83 of the light-transmissive member 80 includes the lower surface of the projection 60 and the lower surface of the outer peripheral portion 70. On the third second lower surface portion 83 of the light-transmissive member 80, the area in which the lower surface of the projection 60 faces the seventh upper surface portion 37 of the lateral wall portion 30 of the substrate 20 can be greater than the area in which the lower surface of the outer peripheral portion 70 faces the seventh upper surface portion 37.

The fourth lower surface portion 84 of the light-transmissive member 80 includes the lower surface of the projection 60 and the lower surface of the outer peripheral portion 70. On the fourth second lower surface portion 84 of the light-transmissive member 80, the area in which the lower surface of the projection 60 faces the eighth upper surface portion 38 of the lateral wall portion 30 of the substrate 20 can be greater than the area in which the lower surface of the outer peripheral portion 70 faces the eighth upper surface portion 38.

In the first region A1, the lower surface of the light-transmissive member 80 includes the lower surface of the projection 60 and the lower surface of the second outer peripheral surface portion 72, which is the lower surface of the outer peripheral portion 70. In the first region A1, the area in which the lower surface of the projection 60 faces the upper surface of the lateral wall portion 30 can be smaller than the area in which the second outer peripheral surface portion 72 faces the upper surface of the lateral wall portion 30.

In the second region A2, the lower surface of the light-transmissive member 80 includes the lower surface of the projection 60 and the lower surface of the fourth outer peripheral surface portion 74, which is the lower surface of the outer peripheral portion 70. In the second region A2, the area in which the lower surface of the projection 60 faces the upper surface of the lateral wall portion 30 can be smaller than the area in which the fourth outer peripheral surface portion 74 faces the upper surface of the lateral wall portion 30.

In the third region A3, the lower surface of the light-transmissive member 80 includes the lower surface of the projection 60 and the lower surface of the sixth outer peripheral surface portion 76, which is the lower surface of the outer peripheral portion 70. In the third region A3, the area in which the lower surface of the projection 60 faces the upper surface of the lateral wall portion 30 can be smaller than the area in which the sixth outer peripheral surface portion 76 faces the upper surface of the lateral wall portion 30.

In the fourth region A4, the lower surface of the light-transmissive member 80 includes the lower surface of the projection 60 and lower surface of the eighth outer peripheral surface portion 78, which is the lower surface of the outer peripheral portion 70. In the fourth region A4, the area in which the lower surface of the projection 60 faces the upper surface of the lateral wall portion 30 can be smaller than the area in which the eighth outer peripheral surface portion 78 faces the upper surface of the lateral wall portion 30.

Figure 6:
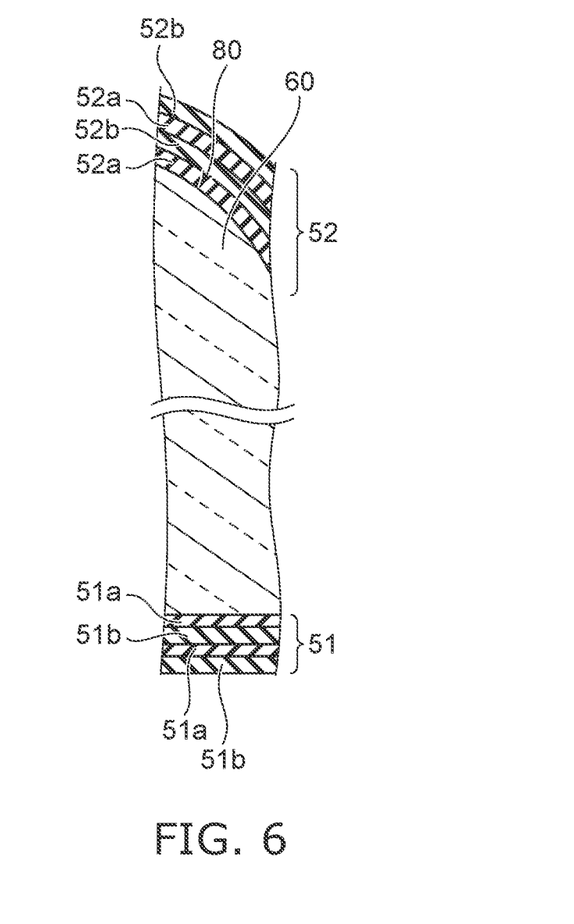
FIG. 6 is a schematic enlarged cross-sectional view of a portion of a light-transmissive member in the light-emitting device of the embodiment of the present disclosure.

The light-emitting device 1 can further include a first coating film 51 disposed on the lower surface of the light-transmissive member 80 as shown in FIG. 6.

The bonding strength between the first coating film 51 and the bonding members 100 can be higher than the bonding strength between the light-transmissive member 80 and the bonding members 100. In this case, the affinity between the material of the outermost surface of the first coating film 51 and the material of the bonding members 100 is higher than the affinity between the material of the light-transmissive member 80 and the material of the bonding members 100. The first coating film 51 can be disposed at least on the first lower surface portion 81, the second lower surface portion 82, the third lower surface portion 83, and the fourth lower surface portion 84. By disposing the first coating film 51 on the first lower surface portion 81, the second lower surface portion 82, the third lower surface portion 83, and the fourth lower surface portion 84, which are to be bonded to the lateral wall portion 30 of the substrate 20 with the bonding members 100, the bonding strength between the light-transmissive member 80 and the substrate 20 with the bonding members 100 therebetween can be improved compared with the case in which the bonding members 100 are bonded to the light-transmissive member 80 without the first coating film 51 therebetween.

For example, the first coating film 51 is an optical film for reducing reflection of light emitted from the light-emitting element 91 at the lower surface of the light-transmissive member 80. For the material of the first coating film 51, an oxide containing at least one selected from the group consisting of, for example, silicon oxide, tantalum oxide, titanium oxide, and zirconium oxide can be used. For example, the first coating film 51 may be a multilayer film in which first films 51a and second films 51b having refractive indices different from each other are alternately layered. In the case of the multilayer film, the first films 51a and the second films 51b are alternately layered in the order from the lower surface side of the light-transmissive member 80, and a second film 51b defines the outermost surface of the first coating film 51. For example, films containing tantalum oxide can be used as the first films 51a, and films containing silicon oxide can be used as the second films 51b. In this case, a film containing silicon oxide defines the outermost surface of the first coating film 51. The affinity between silicon oxide and the resin of the bonding members 100 is higher than the affinity between the material of the light-transmissive member 80 and the resin of the bonding members 100. With this structure, the bonding strength between the light-transmissive member 80 and the substrate 20 can be improved.

The first coating film 51 can be further disposed on the lower surface of the projection 60 of the light-transmissive member 80 facing the light-emitting element 91. The first coating film 51 inhibits light emitted from the light-emitting element 91 located below the projection 60 from being reflected at the lower surface of the projection 60. With this structure, the light extraction efficiency to the outside of the light-emitting device 1 from the projection 60 can be improved.

Figure 7:
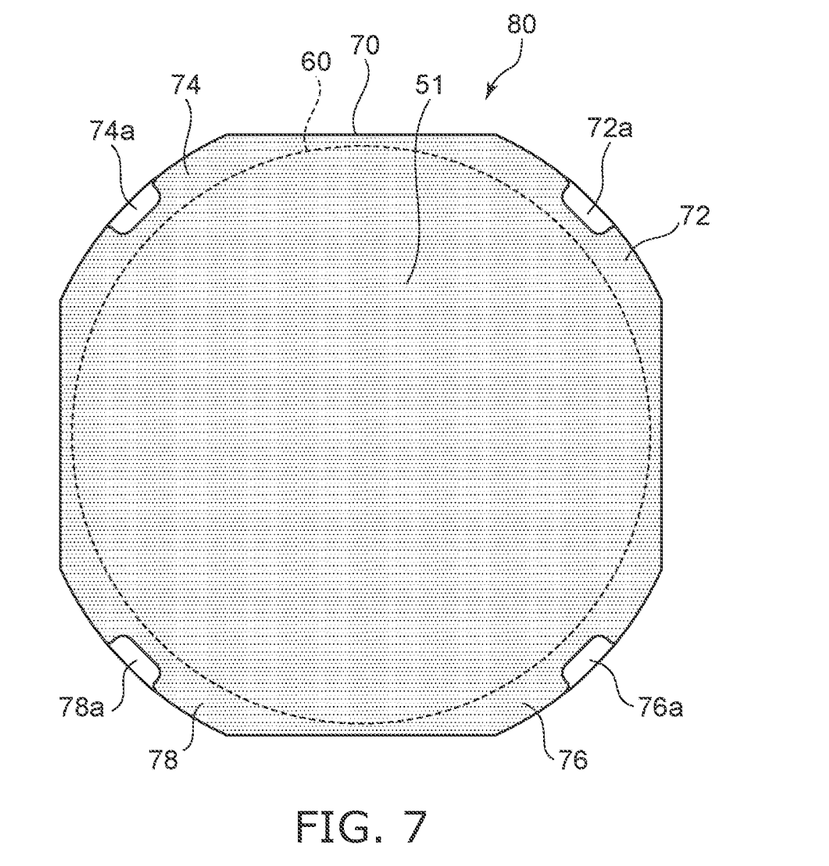
FIG. 7 is a schematic plan view of a lower surface of the light-transmissive member in the light-emitting device of the embodiment of the present disclosure.

In FIG. 7, the first coating film 51 disposed on the lower surface of the light-transmissive member 80 is shown as a shaded portion. The first coating film 51 may not be disposed on at least a portion 72a of the second outer peripheral surface portion 72 of the outer peripheral portion 70 of the light-transmissive member 80 on which the bonding members 100 are not disposed. This structure can relieve the stress on the light-transmissive member 80 and make it difficult for the first coating film 51 to be detached from the lower surface of the light-transmissive member 80 compared with the case in which the first coating film 51 is disposed on the entire lower surface of the light-transmissive member 80.

Similarly, the first coating film 51 may not be disposed on at least a portion 74a of the fourth outer peripheral surface portion 74 on which the bonding members 100 are not disposed. The first coating film 51 may not be disposed on at least a portion 76a of the sixth outer peripheral surface portion 76 on which the bonding members 100 are not disposed. The first coating film 51 may not be disposed on at least a portion 78a of the eighth outer peripheral surface portion 78 on which the bonding members 100 are not disposed.

A second coating film 52 that functions as an optical film can be disposed on the upper surface of the light-transmissive member 80 as shown in FIG. 6. The second coating film 52 reduces reflection at the interface between the upper surface of the light-transmissive member 80 and the outside (air) of the light-transmissive member 80 to thereby improve the light extraction efficiency from the upper surface of the light-transmissive member 80 to the outside.

For example, the second coating film 52 can be a multilayer film in which third films 52a and fourth films 52b having refractive indices different from each other are alternately layered. In the case of the multilayer film, the third films 52a and the fourth films 52b are alternately layered in the order from the upper surface side of the light-transmissive member 80, and a fourth film 52b defines the outermost surface of the second coating film 52. For example, films containing tantalum oxide can be used as the third films 52a, and films containing silicon oxide can be used as the fourth films 52b.

Figure 8B:
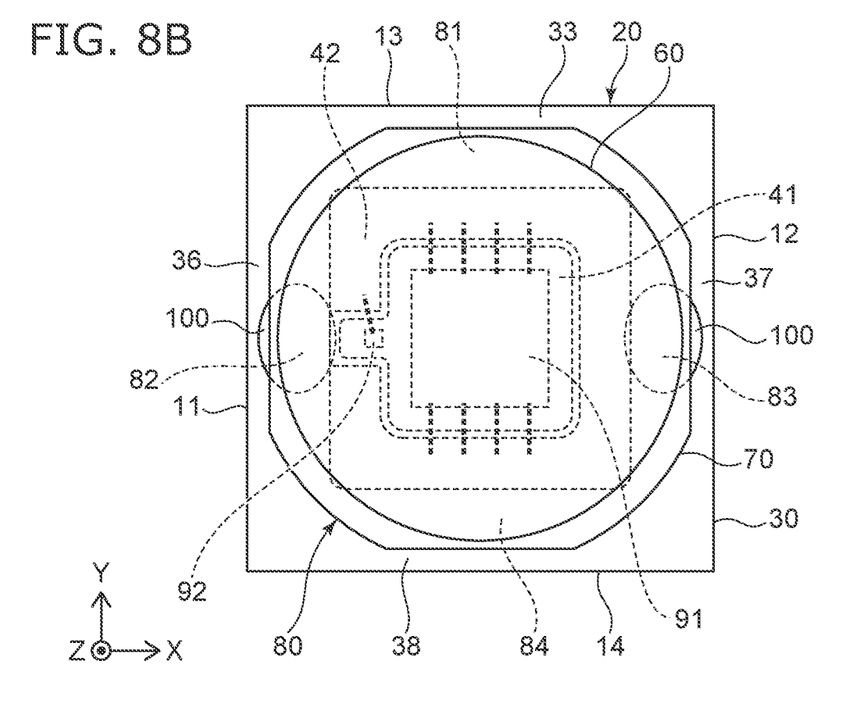
FIG. 8B is a schematic plan view of the upper surface of the light-emitting device showing an example of the arrangement of bonding members in the light-emitting device of the embodiment of the present disclosure.

The bonding members 100 may be disposed only on the upper surface of the lateral wall portion 30 adjacent to respective ones of the pair of sides (the first side 11 and the second side 12) located on both sides of the center of the light-emitting device in the second direction X in the outer periphery of the light-emitting device 1 in a top view. That is, the bonding members 100 may be disposed between the sixth upper surface portion 36 of the lateral wall portion 30 of the substrate 20 and the second lower surface portion 82 of the light-transmissive member 80 and between the seventh upper surface portion 37 of the lateral wall portion 30 of the substrate 20 and the third lower surface portion 83 of the light-transmissive member 80, and may not be disposed between the third upper surface portion 33 of the lateral wall portion 30 of the substrate 20 and the first lower surface portion 81 of the light-transmissive member 80 or between the eighth upper surface portion 38 of the lateral wall portion 30 of the substrate 20 and the fourth lower surface portion 84 of the light-transmissive member 80 as shown in FIG. 8B.

The bonding members 100 may be disposed only on the upper surfaces of the lateral wall portion 30 adjacent to respective ones of the pair of sides (the third side 13 and the fourth side 14) located on both sides of the center of the light-emitting device in the first direction Y in the outer periphery of the light-emitting device 1 in a top view. That is, the bonding members 100 may be disposed between the third upper surface portion 33 of the lateral wall portion 30 of the substrate 20 and the first lower surface portion 81 of the light-transmissive member 80 and between the eighth upper surface portion 38 of the lateral wall portion 30 of the substrate 20 and the fourth lower surface portion 84 of the light-transmissive member 80, and may not be disposed between the sixth upper surface portion 36 of the lateral wall portion 30 of the substrate 20 and the second lower surface portion 82 of the light-transmissive member 80 or between the seventh upper surface portion 37 of the lateral wall portion 30 of the substrate 20 and the third lower surface portion 83 of the light-transmissive member 80.

A plurality of bonding members 100 may be disposed on the upper surfaces of the lateral wall portion 30 adjacent to at least one side of the outer periphery of the light-emitting device. In the example shown in FIG. 8C, two bonding members 100 are disposed between the sixth upper surface portion 36 of the lateral wall portion 30 and the second lower surface portion 82 of the light-transmissive member 80 in the portion adjacent to the first side 11 of the light-emitting device so as to be spaced apart from each other in the direction along the first side 11. Two bonding members 100 are disposed between the seventh upper surface portion 37 of the lateral wall portion 30 and the third lower surface portion 83 of the light-transmissive member 80 in the portion adjacent to the second side 12 of the light-emitting device so as to be spaced apart from each other in the direction along the second side 12.

Figure 8C:
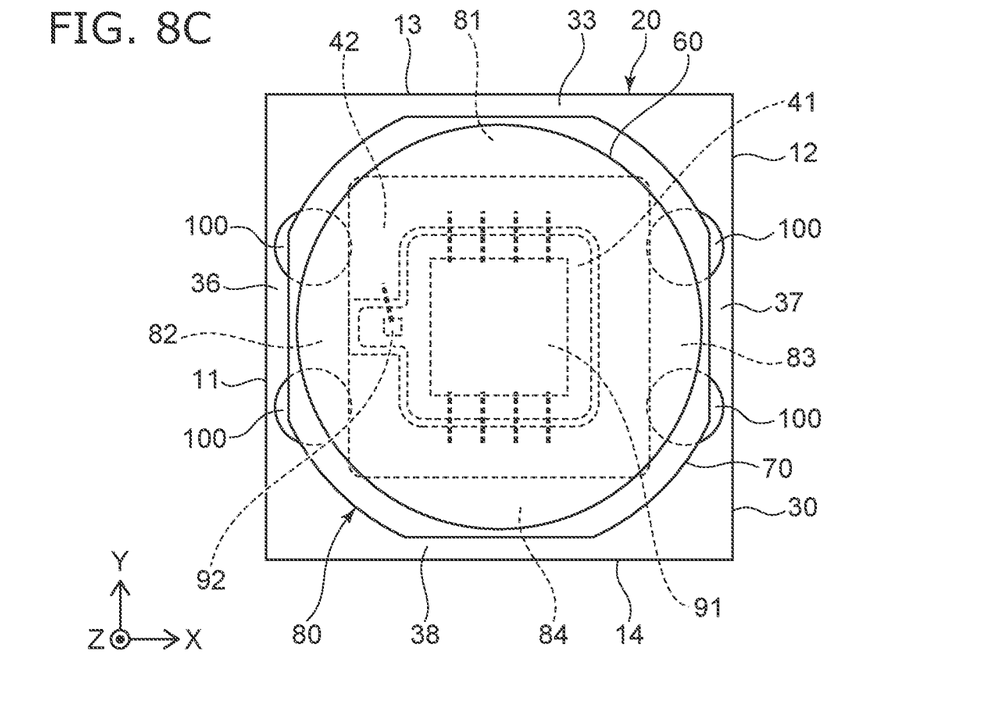
FIG. 8C is a schematic plan view of the upper surface of the light-emitting device showing an example of the arrangement of bonding members in the light-emitting device of the embodiment of the present disclosure.

Alternatively, two bonding members 100 may be disposed between the third upper surface portion 33 of the lateral wall portion 30 and the first lower surface portion 81 of the light-transmissive member 80 in the portion adjacent to the third side 13 of the light-emitting device so as to be spaced apart from each other in the direction along the third side 13, and two bonding members 100 may be disposed between the eighth upper surface portion 38 of the lateral wall portion 30 and the fourth lower surface portion 84 of the light-transmissive member 80 in the portion adjacent to the fourth side 14 of the light-emitting device so as to be spaced apart from each other in the direction along the fourth side 14.

A plurality of bonding members 100 are disposed on the upper surface of the lateral wall portion 30 adjacent to at least one side of the outer periphery of the light-emitting device, which increases the bonding area between the upper surface of the lateral wall portion 30 and the lower surface of the light-transmissive member 80 while reducing the amount of the bonding members 100 compared with the case in which a bonding member 100 is continuously disposed on the upper surface of the lateral wall portion 30, so that the bonding strength can be improved. Two bonding members 100 adjacent to each other in a direction along a side of the light-emitting device may be partially connected to each other.

Figure 8D:
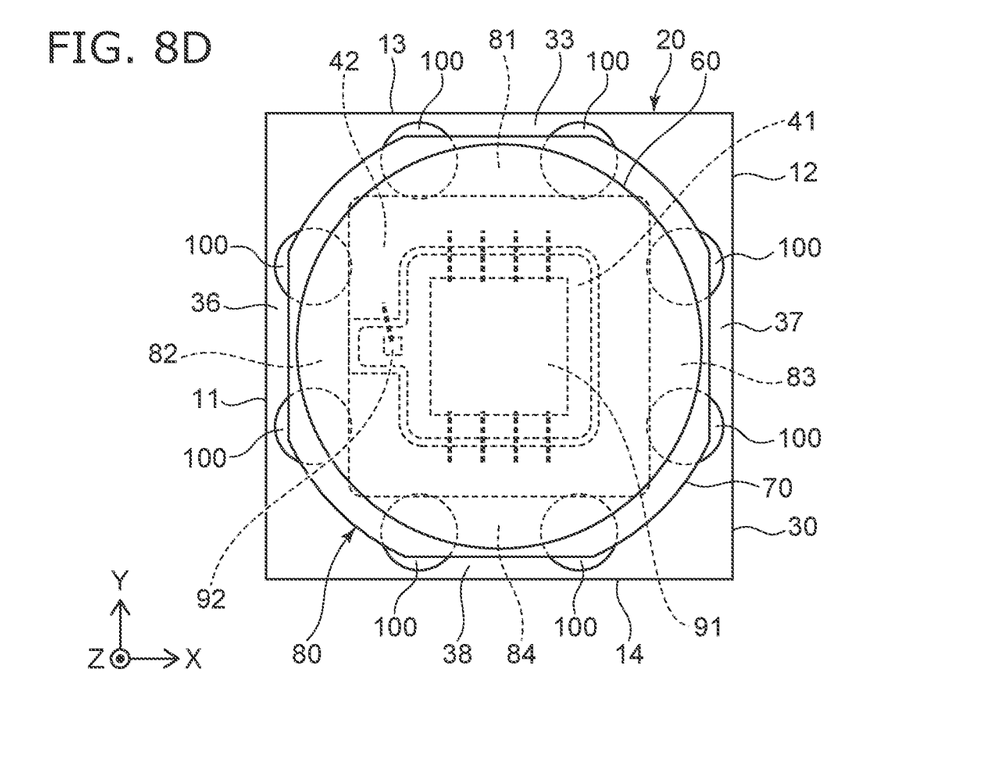
FIG. 8D is a schematic plan view of the upper surface of the light-emitting device showing an example of the arrangement of bonding members in the light-emitting device of the embodiment of the present disclosure.

A plurality of bonding members 100 may be disposed in the portion adjacent to each of the four sides of the outer periphery of the light-emitting device. In the example shown in FIG. 8D, two bonding members 100 are disposed on the upper surface of the lateral wall portion adjacent to each of the four sides of the outer periphery of the light-emitting device.

Figure 8E:
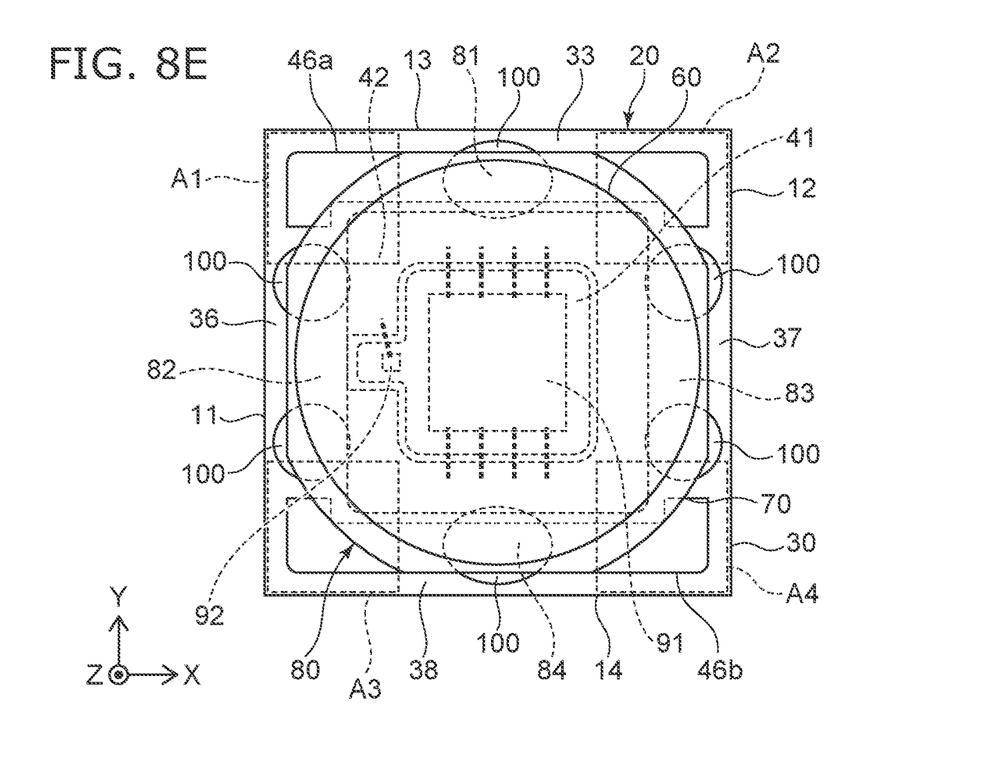
FIG. 8E is a schematic plan view of the upper surface of the light-emitting device showing an example of the arrangement of bonding members in the light-emitting device of the embodiment of the present disclosure.

A metal portion 46a and a metal portion 46b may be disposed on the upper surface of the lateral wall portion 30 of the substrate 20 as shown in FIG. 8E. For example, the metal portion 46a is disposed on the upper surface of the portion of the lateral wall portion 30 adjacent to the third side 13 along the third side 13, and the metal portion 46b is disposed on the upper surface of the portion of the lateral wall portion 30 adjacent to the fourth side 14 along the fourth side 14. A portion of the metal portion 46a is exposed from the light-transmissive member 80 in the first region A1 and the second region A2. A portion of the metal portion 46b is exposed from the light-transmissive member 80 in the third region A3 and the fourth region A4. One of the metal portion 46a and the metal portion 46b is electrically connected to one of the first wiring portion 41 and the second wiring portion 42, and the other one of the metal portion 46a and the metal portion 46b is electrically connected to the other one of the first wiring portion 41 and the second wiring portion 42. Disposing the metal portion 46a and the metal portion 46b on the upper surface of the lateral wall portion 30 allows examination of electrical characteristics and light emission characteristics of the light-emitting device by bringing probe terminals into contact with the metal portion 46a and the metal portion 46b from the upper surface (light-exiting surface) side of the light-emitting device.

In the case in which the metal portion 46a and the metal portion 46b are disposed, the bonding members 100 disposed on the upper surface of the lateral wall portion 30 adjacent to the first side 11 and the second side 12 on which the metal portion 46a and the metal portion 46b are not disposed are unlikely to spread compared with the bonding members 100 disposed on the upper surface of the lateral wall portion 30 adjacent to the third side 13 and the fourth side 14 on which the metal portion 46a and the metal portion 46b are disposed.

The quantity of bonding members 100 disposed on the upper surface of the portions of the lateral wall portion 30 adjacent to the first side 11 and the second side 12 is therefore preferably greater than the quantity of bonding members 100 disposed on the upper surface of the portions of the lateral wall portion 30 adjacent to the third side 13 and the fourth side 14. This can reduce the difference between the sides of the light-emitting device in bonding strength between the lateral wall portion 30 of the substrate 20 and the light-transmissive member 80. In the example shown in FIG. 8E, one bonding member 100 is disposed on the upper surface of the portion of the lateral wall portion 30 adjacent to each of the third side 13 and the fourth side 14, and two bonding members 100 are disposed on the upper surface of the portion of the lateral wall portion 30 adjacent to each of the first side 11 and the second side 12.

The embodiment of the present invention has been described above referring to specific examples. However, the present invention is not limited to these specific examples. All embodiments that can be made by a person skilled in the art by appropriately changing the configuration of the embodiment of the present invention described above are within the scope of the present invention as long as the gist of the present invention is included. A person skilled in the art can think of other various changes and modifications within the idea of the present invention, and such changes and modifications are also within the scope of the present invention.

What is claimed is:

1. A light-emitting device comprising:
   a substrate comprising a lateral wall portion and a bottom portion surrounded by the lateral wall portion;
   a light-emitting element disposed on the bottom portion;
   a light-transmissive member disposed on or above the substrate to cover the bottom portion; and
   a bonding member disposed between an upper surface of the lateral wall portion and a lower surface of the light-transmissive member to bond the lateral wall portion and the light-transmissive member together, wherein:
   in a top view, the light-emitting device includes:
   a first side extending in a first direction,
   a second side extending in the first direction and being parallel to the first side,
   a third side extending in a second direction orthogonal to the first direction,
   a fourth side extending in the second direction and being parallel to the third side,
   a first region located in a corner formed by the first side and the third side, and
   a second region located in a corner formed by the second side and the third side,
   the light-transmissive member comprises a projection covering the bottom portion of the substrate and an outer peripheral portion surrounding the projection in the top view,
   the upper surface of the lateral wall portion includes a first upper surface portion exposed from the light-transmissive member in the first region, a second upper surface portion exposed from the light-transmissive member in the second region, and a third upper surface portion located between the first upper surface portion and the second upper surface portion in the second direction, an upper surface of the outer peripheral portion includes a first outer peripheral surface portion located in the first region, a lower surface of the outer peripheral portion includes a second outer peripheral surface portion opposite to the first outer peripheral surface portion, an area of the first upper surface portion of the lateral wall portion is greater than an area of the first outer peripheral surface portion of the outer peripheral portion, the lower surface of the light-transmissive member includes a first lower surface portion facing the third upper surface portion, an area in which the first lower surface portion faces the third upper surface portion is greater than an area in which the second outer peripheral surface portion faces the upper surface of the lateral wall portion, and the bonding member is disposed between the third upper surface portion and the first lower surface portion.

2. The light-emitting device according to claim 1, wherein a length of each of the first region and the second region in the second direction is 1/6 or more and 1/3 or less of a length of the third side.

3. The light-emitting device according to claim 1, further comprising a coating film disposed at least on the first lower surface portion of the lower surface of the light-transmissive member.

4. The light-emitting device according to claim 3, wherein the coating film is further disposed on a lower surface of the projection facing the light-emitting element.

5. The light-emitting device according to claim 3, wherein an outermost surface of the coating film is constituted of a film containing silicon oxide.

6. The light-emitting device according to claim 3, wherein the coating film is not disposed on at least a portion of the second outer peripheral surface portion.

7. The light-emitting device according to claim 1, wherein, on the first lower surface portion of the light-transmissive member, an area in which a lower surface of the projection faces the third upper surface portion is greater than an area in which the lower surface of the outer peripheral portion faces the third upper surface portion.

8. The light-emitting device according to claim 1, wherein, in the first region, an area in which a lower surface of the projection faces the upper surface of the lateral wall portion is smaller than an area in which the second outer peripheral surface portion faces the upper surface of the lateral wall portion.

9. The light-emitting device according to claim 1, wherein hardness of the substrate is higher than hardness of the light-transmissive member.

10. The light-emitting device according to claim 1, wherein the substrate comprises a ceramic.

* * * * *